Sept. 30, 1958 A. L. WANNLUND, JR., ET AL 2,854,366

METHOD OF MAKING FUSED JUNCTION SEMICONDUCTOR DEVICES

Filed Nov. 25, 1957

Arthur L. Wannlund Jr.,
Warren P. Waters,
*INVENTORS.*

BY *Billy A. Robbins*
*AGENT.*

United States Patent Office 2,854,366

Patented Sept. 30, 1958

2,854,366

METHOD OF MAKING FUSED JUNCTION SEMICONDUCTOR DEVICES

Arthur L. Wannlund, Jr., Rolling Hills, and Warren P. Waters, Inglewood, Calif., assignors to Hughes Aircraft Company, Culver City, Calif., a corporation of Delaware Application November 25, 1957, Serial No. 698,494

13 Claims. (Cl. 148—1.5)

The present invention relates to semiconductor devices and, more particularly, to a method of producing the same.

The present invention is a continuation-in-part of copending United States patent application entitled, "Fused Junction Semiconductor Devices and Method of Making the Same," by Warren P. Waters and Arthur L. Wannlund, Serial Number 532,324, filed September 2, 1955, now abandoned.

In the semiconductor art, a region of semiconductor material containing an excess of donor impurities and having an excess of free electrons is considered to be an N-type region, while a P-type region is one containing an excess of acceptor impurities resulting in a deficit of electrons or, stated differently, an excess of holes. When a continuous solid specimen of semiconductor material has an N-type region adjacent a P-type region, the boundary between the two regions is termed a P–N (or N–P) junction and the specimen of semiconductor material is termed a P–N junction semiconductor device. Such a P–N junction device may be used as a rectifier. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term, "semiconductor material," as utilized herein, is considered generic to germanium, silicon, and alloys of germanium and silicon, and is employed to distinguish these semiconductors from metallic oxide semiconductors consisting essentially of chemical compounds.

The term, "active impurity," is used to denote those impurities which affect the electrical rectification characteristic of semiconductor material as distinguishable from other impurities which have no appreciable effect upon these characteristics. Active impurities are ordinarily classified either as donor impurities—such as phosphorus, arsenic, and antimony—or as acceptor impurities, such as boron, aluminum, gallium, and indium.

The term, "solvent metal," is used in this specification to describe those metals which when in the liquid state become solvents for the semiconductor material which is under consideration and will therefore dissolve areas of semiconductor material which are in contact with the solvent metal. A solvent metal may be a primary element or it may be an alloy. Any solvent metal may be used which will precipitate some atoms of the dissolved semiconductor material upon the remaining undissolved portion of the semiconductor material.

In the prior art method of producing a fused P–N junction in a semiconductor body, a metal specimen, ordinarily in pellet form, containing a solvent metal and including either an acceptor or a donor impurity is melted or fused onto one surface of a heated semiconductor body forming a molten drop which dissolves a small portion of the body, the dissolved portion of the semiconductor body forming an alloy solution with the molten metal specimen. Ordinarily the metal specimen has a relatively low melting point or at least a low eutectic temperature with the semiconductor material, this being desirable so that fusion can be effected readily without raising the temperature of the semiconductor body to values that might injure the electrical characteristics of the semiconductor body. To form the junction region, the assembly which comprises the semiconductor body and the drop of molten solvent metal is allowed to cool to cause precipitation of the dissolved semiconductor together with some atoms of the active impurity to form a regrown crystal region of opposite conductivity type to that of the parent crystal.

As is well known to those skilled in the art, however, the fusion techniques heretofore known to the art, such as the one described above, have several inherent limitations which in turn limit the production of fused junction semiconductor devices. For example, the practice of the above method is restricted to the use of solvent metals which are fairly soft in the solid state and/or which do not differ greatly in their thermal coefficients of expansion from that of the semiconductor material. If solvent metals which do not satisfy these criteria are used, the parent crystal is usually cracked or crazed at the junction region by the alloy button as it solidifies, which seriously impairs the electrical characteristics of the final semiconductor crystal device.

Various methods have been used in the prior art for forming P–N junctions in the manner described above. For example, alloy buttons may be formed by fusing by hand in a small furnace a wire of solvent metal or of an alloy containing an active impurity into the semiconductor wafer. In practice, in the making of P–N–P germanium transistors, for example, this is commonly done by using jigs to position the germanium body while indium in the form of pellets or a wire is brought into contact with the surface of the germanium after the surface of the germanium has been raised to a temperature above the eutectic temperature of germanium-indium alloy. The placement of the germanium-indium alloy which is formed is controlled by the position of the jig. In the formation of large-area fused junction devices, it has been difficult by methods of the prior art to define the junction area and its position in the semiconductor crystal. Various methods of defining the fusion area have been attempted, including the method by which a small layer of gold is first applied to the surface of the semiconductor wafer upon which the junction area is to be formed. By this method the area of the gold layer is defined by plating techniques well known to the art and corresponds to the area upon which the fused junction is to be formed. This layer of gold gives a region upon the semiconductor crystal surface which the alloy being used to form the P–N junction will preferentially wet during the fusion cycle. This method, however, has not proven satisfactory due to the difficulties encountered in quantity production.

In relation to the formation of P–N junctions in the semiconductor art, indium on germanium and gold on silicon have been classified as high penetration alloys since they dissolve a considerable amount of the semiconductor body at the required temperature and redeposit a relatively thick regrown region upon cooling. Lead alloys on germanium and tin alloys on silicon, for example, have been classified as low penetration alloys due to a sharp rise in the solubility of the alloys in the semiconductor at temperatures which are lower than those required to cause dissolution by the high penetration alloys.

Although the fusion process described above and the other improved fusion processes known to the art have been eminently successful for producing P–N junctions, they have the serious limitation that they cannot produce a large-area fused junction. The reasons for the limitation in area of the fused junction produced by these fusion processes are well known to those skilled in the art. Primarily, these difficulties arise from the fact that in fusing a pellet of alloy metal to the parent semiconductor crystal, the substantial thickness of the pellet creates strains which in turn may cause crazing and fissures in the semiconductor crystal body if the area covered by the pellet is excessive.

A method of producing very broad area P–N junctions in semiconductor bodies has been disclosed and claimed in the copending application of Joseph Maserjian, filed February 2, 1955, Serial No. 490,599, entitled "Evaporation-Fused Junction Semiconductor Devices," now Patent Number 2,789,068, and assigned to the assignee of the present application. The method of the Maserjian application comprises the steps of heating a semiconductor crystal body of a predetermined conductivity type to a temperature above the eutectic temperature of the semiconductor crystal body and the solvent metal which is being used to form the fused junction; evaporating a mass of the solvent metal including an active impurity of the type which will convert the body to the desired conductivity type onto the surface of the semiconductor body to form a molten layer of substantial thickness of the solvent metal upon the surface of the semiconductor body and to dissolve a layer of the surface in the molten layer of solvent metal; and cooling the semiconductor body to cause the dissolved semiconductor material to precipitate, together with some atoms of the active impurity, upon the semiconductor body to form an integral regrown crystal region of opposite conductivity type to the semiconductor body.

The method of the Maserjian application yields excellent results and forms high quality large-area fused P–N junctions. Where it is not desirable to form a fused P–N junction over the complete surface area of the semiconductor wafer, it is necessary to define the region over which the junction area is to be formed. In doing this, various difficulties are encountered. For example, in the formation of a transistor, it is desirable that the collector junction have an area greater than the emitter junction. In order to define these areas, various methods have been developed. However, if high penetration alloys are used, it is difficult to control the amount of penetration and the accuracy of the temperature cycle is quite critical. If plating, such as the gold plating described above, is used to control the area of penetration, it is difficult to plate on the etched surface which is required for the fusion process and gold plating in particular does not yield satisfactory results for low penetration alloys. The low penetration alloys require semiconductor wafers having very thin base regions which the alloy button does not completely cover, making the resulting device quite weak and the base region resistances extremely high. The thin resulting regrown region also results in short leakage paths across its surface.

Accordingly, it is an object of the present invention to provide a method for producing a fused junction semiconductor device having an accurately positioned fused junction therein.

It is another object of the present invention to provide a method for producing a fused junction semiconductor device having a large area regrown crystal region of controlled thickness and configuration therein.

It is another object of the present invention to provide a method for producing a fused junction semiconductor device having a large-area exposed surface of the regrown crystal region.

It is a further object of the present invention to provide a method for producing a fused junction semiconductor device having a planar P–N junction which is positioned at a predetermined depth below the surface of the semiconductor body.

It is a still further object of the present invention to provide a method for producing a fused junction semiconductor device which lends itself easily to mass production techniques.

The method of the present invention comprises the steps of forming a pit, having a predetermined configuration, in a surface of a semiconductor crystal body; depositing molten solvent metal which may include an active impurity at least in the pit; cooling the semiconductor body and solvent metal; and removing the solidified layer of solvent metal, and the regrown crystal region which has been formed, from the surface of the semiconductor body, whereby a regrown crystal region having a configuration similar to the configuration of the pit remains within the semiconductor body.

The novel features which are believed to be characteristic of the invention, both as to its organization and method of operation, together with further objects and advantages thereof, will be better understood from the following description considered in connection with the accompanying drawing in which an embodiment of the invention is illustrated by way of example. It is to be expressly understood, however, that the drawing is for the purpose of illustration and description only and is not intended as a definition of the limits of the invention.

Figure 1:
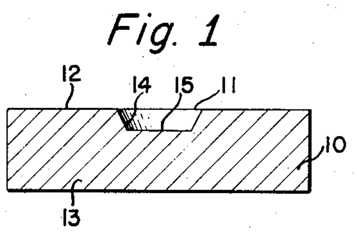
Fig. 1 is a sectional schematic diagram of a semiconductor crystal body in which a pit has been formed.

Referring now to the drawing wherein like reference characters designate like or corresponding parts throughout the several figures, there is shown in Fig. 1 a semiconductor crystal wafer 10 in which a pit 11 has been formed as the initial step of the method of the present invention for forming P–N junctions. For purposes of illustration, the method of the present invention will be described with respect to the production of a fused silicon P–N junction in which the semiconductor crystal body is N-type silicon, while the regrown crystal region is P-type. It will be recognized, however, that the method described herein may also be employed for producing fused P–N junctions in germanium and silicon-germanium alloys, and also for producing P–N junctions in silicon, germanium and silicon-germanium alloys, in which the semiconductor crystal body is P-type and the regrown region is N-type.

In producing a fused P–N junction in silicon by the method of the present invention, aluminum is preferably used as a combined solvent metal and active impurity. In addition to being an acceptor impurity, aluminum allows a wide tolerance in the temperatures used in the method and exhibits very little diffusion in the silicon, thereby providing a clearly defined P–N junction. Although aluminum is used as a combined solvent metal and active impurity in the present embodiment, it will be apparent to those skilled in the art that other solvent metals, for example, gold, platinum, silver and tin, may be used when combined with the proper active impurity. The solvent metal may be a primary element or an alloy which has a relatively low melting point or at least a low eutectic temperature with the semiconductor material, and must be a metal capable of forming a eutectic alloy with the silicon or germanium or an alloy of the two which is used as the semiconductor material. The active impurities which may be used in the present method are those ordinarily classified either as donor impurities, including phosphorus, arsenic and antimony, or as acceptor impurities, including aluminum, gallium, boron and indium. The solvent metals and active impurities will be determined by the conductivity type of the crystal region to be regrown. For example, an alloy of gold and antimony may be used for N-type regrown regions on P-type bodies. Further, although aluminum when used as a solvent metal for silicon is classified as a high penetration alloy, as described hereinbefore, the method of the present invention may be practiced with equally good results when using a low penetration alloy, such as, for example, lead as a solvent metal for germanium, and tin as a solvent metal for silicon.

Referring again to Fig. 1, the N-type silicon body 10 is preferably a silicon single crystal which has been cut to a slab of predetermined thickness and which has been crystallographically oriented so that its upper surface 12 and lower surface 13, as viewed in Fig. 1, are the (111) surface planes of the crystal. The semiconductor body may be of any desired area. Crystallographic orientation of the specimen is not necessary but is desirable to promote the growth of planar P–N junctions within the specimen during the fusion operation which will be described hereinafter. At the present, it appears to be preferable to employ the (111) surface plane for carrying out the method of this invention, the theory being that the relatively high atomic density of the crystal in this particular plane permits better control of subsequent operations. It should be pointed out, however, that other relatively dense crystallographic surface planes, such as the (110), (100) and (112) planes, may be employed satisfactorily in carrying out the method of this invention.

As an example of the method of the present invention, the manufacture of a single high current-carrying diode will be described in which a square silicon wafer having a width of approximately ⅛ of an inch and a thickness of the order of 25 mils is used. The silicon semiconductor body 10 is lapped to the predetermined thickness of .025 of an inch, to remove surface damage produced by the cutting operation and to provide a specimen of uniform thickness. One commercially available lapping compound which has been satisfactorily employed for performing lapping operations is 302 mesh Alundum abrasive.

A pit 11 or cavity is then formed in the surface of the silicon wafer by sandblasting or other means known to the art. Pit 11 may be any geometric configuration or physical location which may be desired according to the design considerations for any particular application. In the present embodiment, the pit 11 has a depth of the order of 3 mils and a diameter at the surface of the order of 45 mils. It should be noted that by the method of forming the pit, the configuration of the pit 11 is slightly frusto-conical with smooth sloping sides 14 and a flat smooth bottom surface 15 of circular outline. Although the method of forming the pit is not critical to the method of the present invention, excellent results have been achieved by directing a high pressure stream of abrasive particles, such as finely divided aluminum oxide, against the surface of the silicon wafer. Abrasive particles of closely controlled particle size may be used to form the cutting stream. In the presently preferred embodiment, commercially available abrasive, such as S. S. White Airbrasive Powder No. 1, which is aluminum oxide having an average particle size of 27 microns, is especially suitable. Commercially available devices which provide a mixture of the abrasive particles in a dry inert gas stream give excellent results.

After formation of the pit 11 the silicon wafer is preferably etched in any one of several suitable etchants known to the art to remove surface damage and imperfections. The etching step may be carried out, for example, by immersing the semiconductor body for thirty seconds in a solution containing equal parts of nitric acid, hydrofluoric acid and acetic acid. The wafer is then rinsed in distilled water, followed by a second rinse in absolute methyl alcohol.

Figure 2:
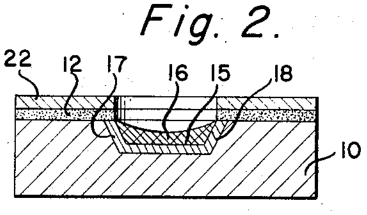
Fig. 2 is a sectional schematic diagram of the semiconductor crystal body of Fig. 1 after the regrown crystal region has been formed.

A molten layer 16 of solvent metal is then deposited upon the semiconductor body 10 to a depth sufficient to wet the sides of the pit 11. The solvent metal may be allowed to cover the entire surface as shown in Fig. 2 or only a portion thereof if desired. Although the molten solvent metal may be deposited within the pit of the silicon body by other methods known to the art, the method disclosed and claimed in the copending application of Maserjian, supra, is found to be particularly advantageous and to yield excellent and reproducible results. Therefore, in this illustrative embodiment, a quantity of aluminum is evaporated from a tungsten filament onto the surface of the silicon wafer which has been previously raised to a temperature of the order of 800° C. within an evacuated chamber. The amount of aluminum which is deposited need be only that amount sufficient to completely wet the sides of pit 11. The surface tension forces involved will cause the aluminum or other solvent metal within the pit to be pulled toward the sides of the pit as shown in Fig. 2, thus aiding in achieving wetting of the sides of the pit.

It may be desirable in some instances to preclude deposition of the molten metal upon the surface of the semiconductor body and restrict it solely to the pit. This may be accomplished by masking all of surface 12 except for the pit 11 by applying thereto some material which the deposited molten metal will not penetrate as shown at 21 in Fig. 2. It has been found that a colloidal suspension of graphite such as that supplied by the Acheson Colloids Co. under the trademark name of Dag is quite successful.

Figure 3:
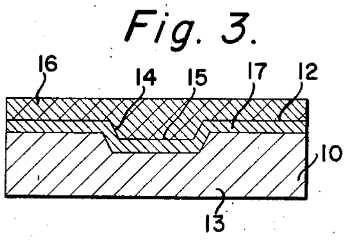
Fig. 3 is a sectional schematic diagram of an alternate embodiment of the semiconductor crystal body of Fig. 1 after the regrown region has been formed.

In some instances it may be desirable to deposit the molten metal both in the pit and upon the surface of the body to a depth sufficient to completely fill the pit and cover the surface as shown in Fig. 3. In such a case the amount of aluminum which is deposited is such that a quantity of molten aluminum sufficient to cover the surface 12 of the silicon wafer surrounding the pit 11 to a depth of the order of 1 mil and to a depth of the order of 4 mils above the pit floor 15 is used.

In either of the above embodiments upon contact of the molten metal with the semiconductor body, a portion of the body is dissolved. Where only the surfaces of the pit are completely wet, that portion of the body immediately adjacent the pit is dissolved as shown in Fig. 2. If the molten metal is deposited on the surface of the body on a part thereof as well as in the pit, then a portion of the surface is also dissolved as shown in Fig. 3. In short, those portions of the semiconductor body contacted by the molten metal are dissolved thereby.

In either of the above embodiments, after the molten aluminum has been deposited, the silicon body is allowed to cool at a controlled cooling rate to a temperature of the order of 100° C. and is then allowed to cool by uncontrolled cooling to room temperature.

In forming the P–N junction by the evaporation of aluminum onto the silicon surface, it is important to determine and control: the temperature of the surface of the semiconductor body; the amount of the molten aluminum evaporated into the pit; and the rate of deposition of aluminum onto the silicon body. The rate of cooling after evaporation and fusion is not critical to the same degree as are the above parameters. However, for optimum use of the method and to obtain reproducible uniform quality of junctions, the rate of cooling should be controlled and should be substantially constant.

The amount of semiconductor material which will be dissolved by the molten solvent metal is dependent upon the quantity of molten metal present in the pit and upon the surface of the semiconductor body, and the temperature of the semiconductor body. The amount of semiconductor material which will be dissolved by a predetermined amount or weight of a solvent metal at a given temperature can be readily determined by referring to the binary phase diagram for the alloy of the semiconductor material and the solvent metal, such as those which appear in the "Metals Reference Book," by Smithalls, published by New York Interscience Publishers Inc. (1949 edition). From the binary phase diagram for aluminum-silicon alloy, it may be seen that the range of fusion temperatures at which the present method is operable must be between the eutectic temperature of aluminum-silicon which is 577° C., and the melting point of silicon which is 1420° C. The deposition of a layer of molten aluminum upon the surface of a silicon crystal which has a surface temperature of 600° C., will dissolve an amount of silicon equal in weight to approximately 14 percent of the weight of the aluminum. At 800° C. dissolved silicon will constitute about 28 percent of the weight of the molten aluminum which is in phase equilibrium with the solid silicon body. For example, at 800° C. the regrown crystal region will be 0.3 times the volume of the molten aluminum evaporated into the pit and onto the silicon surface, while at 900° C. it will be nearly 0.5 times. Thus, in the above referred to embodiment in which a pit having a depth of 3 mils is used and in which sufficient molten aluminum is deposited to cover the surface to a depth of 1 mil above the surface 12, a regrown region 17 which is 0.3 mil at the surface 12, approximately 1.5 mils at the pit surface 15, and approximately 1.0 mil surrounding the pit walls 14 is formed.

It has been found in practicing the method of the present invention that a temperature range between 700° C. and 900° C. is preferable when aluminum is used as a combined solvent metal and active impurity with a silicon body. Above the temperature of 900° C. penetration of the molten aluminum into the solid silicon body is rapid and excessive, causing difficulty in control and decrease in the lifetime of the carriers at the junction, which results in a decrease in forward current possible through the junction.

When aluminum is deposited in the pit and if desired onto the surface by evaporation, the rate of evaporation of the solvent metal and active impurity is also a critical parameter. At a relatively high temperature of fusion, i. e., 800° C., the rate of evaporation is less critical than at a fusion temperature near the eutectic point of the semiconductor material and solvent metal alloy since the rate of penetration is greater at the higher temperature. The rate of evaporation may be easily determined in view of what has been discussed hereinbefore by routine experiment for particular solvent metals by one skilled in the art. In using aluminum and silicon, a rate of evaporation of less than .001 mil per second and fusion temperatures below 800° C. will not yield satisfactory results, while obviously there is no upper limit on the evaporation rate.

The depth of the pit which may be used in carrying out the method of the present invention is dependent only upon the amount of solvent metal which may be uniformly deposited or placed in the pit and upon the limits which have been given hereinbefore for the amount of solvent metal which must be present in order to form a P–N junction. Cavities varying in diameter from 10 mils to 100 mils and in depth from 1 mil to 10 mils have been successfully used.

Referring now to Figs. 2 and 3, Fig. 2 illustrates schematically the formation of the P–N junction within the semiconductor body which is obtained by the method first described above. Since the temperature of the silicon surface is above the eutectic temperature for aluminum-silicon alloy, molten aluminum deposited into the pit will dissolve a substantial portion of the silicon with which it is in contact. The molten aluminum deposited on the coated surface 12 forms a layer 22 which does not contact the body 10. As the silicon body is allowed to cool, the solubility of the silicon in the molten aluminum decreases and, as a result, some of the dissolved silicon, together with some atoms of the aluminum which acts as the acceptor active impurity, begins to precipitate out of the liquid aluminum-silicon solution, depositing preferentially on the parent N-type silicon body 10 to form a regrown P-type silicon region 17. As the temperature is further decreased, the remainder of the aluminum and dissolved silicon solidifies as a layer of eutectic aluminum-silicon alloy 16 which is ohmically connected to the P-type regrown region 17. The P-type regrown region follows the configuration of the pit 11 which was formed in the surface of the semiconductor body and will cover that portion of the surface upon which the molten aluminum was deposited.

Figure 4:
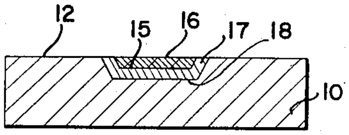
Fig. 4 is a sectional schematic diagram of the semiconductor body of Fig. 2 or Fig. 3 after the excessive solvent metal and regrown crystal region have been removed, showing the completed fused P–N junction.

After the fusion cycle is complete and the regrown crystal region 17 has been formed as shown in Fig. 2 or Fig. 3, the layer of alloy 16 or aluminum 22 and regrown crystal upon the surface 12 of the semiconductor crystal body, if any is present, are removed as illustrated in Fig. 4. In the presently preferred embodiment, the upper surface 12 of the silicon body 10 upon which the aluminum has been evaporated is placed with the alloy surface down upon a lapping plate, and the aluminum alloy layer 16 and the thin junction layer 17 formed along the surface area 12 of the silicon body are removed by hand or mechanical lapping with a fine 800 grit abrasive. Referring to Fig. 4, this produces a small area of aluminum-silicon alloy 16 surrounded by a regrown crystal region 17 which in turn forms a P–N junction 18 with the silicon body 10. The surface area 12 of the semiconductor body then comprises a surface region of N-type silicon, an area of P-type silicon, and an area of aluminum-silicon alloy. Since the regrown crystal region is slightly frusto-conical, it is an added advantage that the regrown region meets the surface of the semiconductor body at an angle and that the lapping cuts across the regrown region 17 along a diagonal which increases its width at the surface of the semiconductor body.

The semiconductor body is then etched to clean off various surface imperfections and damage which may have been produced, and a semiconductor diode is completed by methods well known to the art, i. e. an electrode is affixed to the aluminum-silicon alloy area, an ohmic contact is formed on the lower surface, an electrode is affixed thereto, and the assembly may be encapsulated.

From the foregoing it will be apparent to one skilled in the art that the volume and configuration of the pit which is formed in the surface of the semiconductor body will be dependent upon the configuration and size of the regrown crystal region and P–N junction which are desired. When the semiconductor material is dissolved by the molten solvent metal and precipitated upon cooling, the P–N junction is formed at the surface where dissolution ended and precipitation began. The P–N junction which is formed, therefore, has a configuration similar to the configuration of the pit which was originally formed, but defines a volume which is larger than the original volume of the pit by an amount equal to the volume of semiconductor material which was dissolved. Similarly, the inner surface of the regrown crystal region has a configuration substantially similar to the original configuration of the pit and defines a volume which is substantially equal to, but greater than, the volume of the pit by an amount equal to the amount of semiconductor material which remains in the aluminum to form the volume of aluminum eutectic alloy which fills the remainder of the original volume of the pit. For example, if a cylindrical or slightly frusto-conical pit having a depth of 3 mils and a diameter at the surface of 45 mils is used, the diameter of the frusto-conical section defined by the P–N junction is of the order of 48 mils at the surface and has a depth of the order of 45 mils. Similarly, the frusto-conical section defined by the junction of the regrown crystal region and the aluminum-silicon eutectic alloy has a diameter at the surface of the order of 45 mils and a depth of 3 mils.

It is well known in the art that it is sometimes difficult to attach electrodes directly to the silicon-aluminum eutectic alloy. Where this difficulty is encountered it may be desirable to remove the eutectic alloy and substitute therefore another metallic substance which will provide ohmic contact with the regrown region and which will provide easier connection of electrodes. Such a configuration is shown in Fig. 5.

Figure 5:
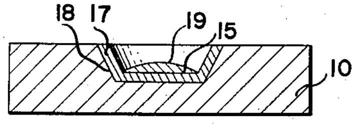
Fig. 5 is a sectional schematic diagram of the semiconductor crystal body of Fig. 4 after the remaining eutectic alloy has been removed and replaced with a metal to form an ohmic contact with the regrown region.

Referring now more particularly to Fig. 5, the eutectic alloy 16 of Fig. 4 may be removed by etching surface 12 in a dilute hydrochloric acid mixture such as 50–50 hydrochloric acid-water. In order to obtain optimum results, it is desirable to heat the etchant mixture. This acid etchant will vigorously attack the eutectic alloy without substantially affecting the surface 12 or regrown region 17 of the semiconductor body. After this etching the body is washed and dried in the conventional manner as hereinbefore described. A globule of metallic material 19 such as gold, silver, germanium or the like is then attached to regrown region 17. The attachment of the metallic material may be accomplished by any method known to the art, such as evaporation, fusion, plating or the like.

Although the above method has been described in connection with the fabrication of a single semiconductor translating body, it will be apparent to those skilled in the art that a plurality of such semiconductor bodies may be produced upon a single semiconductor crystal which is then divided to yield a plurality of devices. For example, by utilizing a silicon wafer which is approximately one inch in diameter, forty pits may be formed in the surface of the silicon wafer. The pits are regularly spaced upon the surface and are again of the order of 45 mils in diameter and 3 mils in depth. The surface of each of the pits is then completely wet with molten aluminum and if desired the surface of the wafer is covered as described hereinbefore. Thus, forty P–N junction regions within the single silicon wafer are formed. The wafer may then be divided to yield forty separate signal translating devices.

Figure 6:
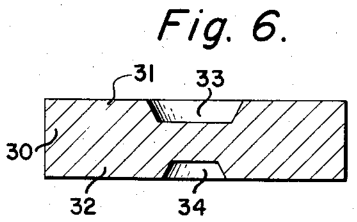
Fig. 6 is a sectional schematic diagram of a semiconductor crystal body corresponding to Fig. 2 but in which a collector and emitter P–N junction are to be formed in the production of a transistor.

The present invention has been dscribed in conjunction with the formation of a diode or a semiconductor translating body having a single P–N junction. However, the method may be used to particular advantage in the fabrication of other semiconductor devices, such as transistors. For example, referring to Figs. 6 and 7, the formation of a fused junction transistor is illustrated schematically. Again using silicon as the semiconductor crystal and aluminum as the combined solvent metal and active impurity, there is shown in Fig. 6 a silicon body in which pits, or cavities, have been formed which will determine the configuration and depth of the collector and emitter fused P–N junctions. In this embodiment, a silicon crystal 30 having a square surface area 31 approximately ⅛ of an inch on a side and a thickness of the order of 15 mils is used. After the silicon wafer 30 has been etched and otherwise prepared, as described hereinbefore, a collector pit 33 of the order of 45 mils in diameter at the surface 31 and 3 mils in depth is formed in the first surface 31 of the silicon wafer. An emitter pit 34 is formed symmetrically about the centerline of the collector pit 33 and has a diameter of the order of 25 mils at the second surface and a depth of the order of 3 mils. The bases of the pits are planar and parallel and separated by a predetermined thickness of the silicon wafer. Both pits are formed in this embodiment by sandblasting as described hereinbefore and may, of course, be of any configuration desired.

The silicon wafer is then placed in an evacuated chamber with the first surface 31 upward and heated to a temperature of the order of 800° C. Aluminum is evaporated to deposit sufficient aluminum to completely wet the collector pit 33 and, if desired, to cover the first surface 31. The crystal is then cooled to form a P-type regrown collector region 35 (see Fig. 7) surrounding the aluminum-silicon alloy which now fills the collector pit 33 and covers the first surface 31. The second surface is then placed upward in the evacuated chamber where it is heated to a temperature of the order of 800° C. Molten aluminum is deposited to completely wet the emitter pit 34 and, if desired, cover the second surface 32 with a film of molten aluminum of the order of 1 mil in thickness. The silicon wafer is again cooled at a controlled cooling rate to form the second regrown P-type region 36 surrounding the emitter pit 34 which is now filled with aluminum-silicon alloy and covers the second surface 32. At 800° C. and using cavities of the volumes given, the regrown regions 35, 36 which are formed at the parallel bases of the cavities 33, 34 are of the order of 1 mil in thickness. Thus, referring to Fig. 7, an N-type base region 37 between the parallel collector and emitter junction regions 38, 39 is of the order of 3 mils in thickness. By controlling the depth of the pits and the temperature at which the molten solvent metal is deposited in the pits, the thickness of the base region may be accurately predetermined. Thus, emitter and collector P–N junctions in the transistor are accurately positioned within the semiconductor body and are separated by a closely controlled base region.

Figure 7:
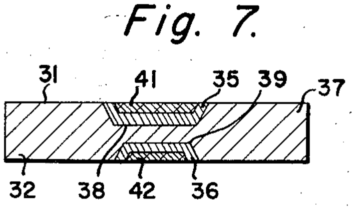
Fig. 7 is the transistor crystal body of Fig. 4 showing the completed emitter and collector P–N junction areas.

The aluminum-silicon alloy 41, 42 and P-type regions 35, 36 at the surfaces 31, 32 are then removed from first and second surfaces by lapping or grinding as described hereinbefore to complete the transistor body as shown in Fig. 7. The surface of the transistor body then has an area of aluminum-silicon eutectic alloy 41 surrounded by an area of P-type silicon 35 which forms a circular P–N junction 38 with the N-type surface 31 of the silicon body. Electrical connections (not shown) to the aluminum-silicon alloy regions 41, 42 are then made and the transistor body is encapsulated by methods well known to the art to yield a finished transistor. The eutectic alloy may be removed and replaced with other metal as hereinabove described if such is desired for any given application and the electrical connections made thereto.

Although a transistor having both collector and emitter junctions positioned at a depth from opposed surfaces of the semiconductor body has been described, it is advantageous for some transistor devices to have the collector P–N junction positioned within the semiconductor body while the emitter P–N junction is positioned at or near the opposed surface. It is sometimes desirable to form the collector junction by the method of the present invention and to form the emitter junction by wire fusion or by one of the methods known to the prior art to position it at the surface.

The method of making a single transistor has been described; however, it will be apparent to those skilled in the art that a plurality of transistor bodies may be formed simultaneously, in a manner described hereinbefore, in connection with the fabrication of a plurality of diodes by forming a plurality of opposed collector and emitter regions in a single semiconductor wafer and then dividing the wafer to yield a plurality of finished transistor bodies. Thus, the method disclosed herein makes possible the production of fused P–N junctions in semiconductor devices which are accurately positioned and defined within the semiconductor body. In addition, the method of the present invention provides transistors in which the base region may be more accurately controlled in thickness and in physical location than has heretofore been possible in the prior art. The ability to predetermine and control the physical configuration and location of regrown crystal regions and P–N junctions in semiconductor crystal bodies in turn makes possible the production of semiconductor translating devices having electrical characteristics superior to those devices heretofore known to the art. Further, the method described herein lends itself to mass production techniques.

What is claimed is:

1. The method of producing, defining and positioning an integral regrown crystal region of one conductivity type in a semiconductor crystal body having a predetermined conductivity type comprising: forming a cavity in the surface of said semiconductor body, said cavity having a configuration similar to the configuration of the regrown crystal region to be formed; depositing a molten layer of solvent metal including an active impurity in said cavity sufficient to completely wet the surfaces of said cavity, said semiconductor body being at a temperature above the eutectic temperature of said solvent metal and said semiconductor material; and cooling said semiconductor body to cause the dissolved semiconductor material to precipitate, together with some atoms of said active impurity, upon said surfaces of said cavity, whereby a P–N junction having substantially the configuration of said cavity is formed wtihin said semiconductor body.

2. The method of producing, defining and positioning an integral P-type regrown crystal region in an N-type semiconductor crystal body comprising: forming a cavity in a surface of said semiconductor body, said cavity having a configuration similar to the configuration of the P–N junction to be formed, depositing a molten layer of sufficient thickness of solvent metal including an active impurity in said cavity to completely wet the surfaces of said cavity, said semiconductor body being at a temperature above the eutectic temperature of said solvent metal and said semiconductor material, said active impurity being selected from the group consisting of aluminum, gallium, and indium; and cooling said semiconductor body to cause the dissolved semiconductor material to precipitate, together with some atoms of said active impurity, upon the surfaces of said cavity to form an integral P-type regrown crystal region, whereby a P–N junction having substantially the configuration of said cavity is formed.

3. The method of producing, defining and positioning an integral N-type regrown crystal region in a P-type semiconductor crystal body comprising: forming a cavity in a surface of said semiconductor body, said cavity having a configuration similar to the configuration of the P–N junction to be formed; depcsiting a molten layer of sufficient thickness of solvent metal including an active impurity in said cavity to completely wet the surfaces of said cavity, said semiconductor body being at a temperature above the eutectic tempertaure of said solvent metal and said semiconductor material, said active impurity being selected from the group consisting of antimony, arsenic, and phosphorus; and cooling said semiconductor body to cause the dissolved semiconductor material to precipitate, together with some atoms of said active impurity, upon the surfaces of said cavity to form an integral N-type regrown crystal region, whereby an N-type regrown crystal region and P–N junction having a configuration substantially similar to that of said cavity is formed within said body.

4. The method of producing, defining and positioning an integral regrown crystal region of one conductivity type in a semiconductor crystal body having a predetermined conductivity type, comprising: forming a cavity in the surface of said semiconductor body, said cavity having a configuration similar to the configuration of the regrown crystal region to be formed; depositing a molten layer of substantial thickness of solvent metal in said cavity and upon at least that portion of said surface immediately surrounding said cavity, said solvent metal being an active impurity of the type which determines the conductivity type of the integral regrown region; heating said semiconductor body to a temperature above the eutectic temperature of said solvent metal and said semiconductor material; cooling said semiconductor body to cause the dissolved semiconductor material to precipitate, together with some atoms of said active impurity, upon said portion of said surface of said semiconductor body and the surfaces of said cavity; and removing the regrown crystal region from said surface of said semiconductor body, whereby a regrown crystal region and P–N junction having a configuration substantially similar to that of said cavity is formed within said body.

5. The method of producing, defining and positioning an integral regrown crystal region of one conductivity type in a semiconductor crystal body having a predetermined conductivity type comprising: forming a pit in the surface of said semiconductor body, said pit having a configuration similar to the configuration of the regrown crystal region to be formed; heating said semiconductor body to a temperature above the eutectic temperature of aluminum and said semiconductor material; depositing a molten layer of substantial thickness of aluminum in said pit and upon said surface; cooling said semiconductor body to cause the dissolved semiconductor material to precipitate, together with some atoms of aluminum, upon said surface of said semiconductor body and the surfaces of said pit; and removing the alloy of aluminum and the semiconductor material and the regrown crystal region from said surface of said semiconductor body, whereby a regrown crystal region and P–N junction having a configuration substantially similar to that of said pit is formed within said body.

6. The method of producing, defining and positioning an integral regrown P-type crystal region in an N-type silicon body, comprising: forming a pit in a surface of said silicon body, said pit having a configuration similar to the configuration of the regrown crystal region to be formed; depositing a molten layer of substantial thickness of aluminum to substantially fill said pit and to cover said surface, said silicon body being at a temperature above the eutectic temperature of aluminum and silicon; cooling said silicon body to cause the dissolved silicon to precipitate, together with some atoms of aluminum, upon said surface of said silicon body and the surfaces of said pit; and removing the aluminum-silicon alloy and regrown crystal region from said surface of said semiconductor body, whereby a P-type regrown crystal region and P-N junction having a configuration substantially similar to that of said pit is formed within said silicon body.

7. The method of producing, defining and positioning an integral regrown crystal region of one conductivity type in a semiconductor crystal body of the opposite conductivity type, comprising: forming a pit in a surface of said semiconductor body, said pit having a configuration similar to the configuration of the regrown crystal region to be formed; forming a molten solvent metal in said pit and a layer of substantial thickness of solvent metal upon at least that portion of said surface immediately surrounding said pit, said semiconductor body being at a temperature above the eutectic temperature of said solvent metal and said semiconductor material, said active impurity being of a type which determines the conductivity type of the said integral regrown crystal region, said molten layer having a thickness above said surface within the range from 0.2 mil to 10 mils; cooling said semiconductor body to cause the dissolved semiconductor material to precipitate, together with some atoms of said active impurity, upon said surface of said semiconductor body and the surfaces of said cavity; and removing the alloy of said solvent metal and said semiconductor material and the regrown crystal region from said surface of said semiconductor body, whereby a regrown crystal region and P–N junction having a configuration similar to that of said cavity is formed within said body.

8. The method of producing, defining and positioning an integral regrown crystal region of one conductivity type in a semiconductor crystal body having a predetermined conductivity type, comprising: forming a cavity in a surface of said semiconductor body, said cavity having a substantially planar base and a configuration similar to the configuration of the regrown crystal region to be formed, said planar base of said cavity being at a depth from said surface of said semiconductor body within the range of from approximately 1 to 10 mils; depositing a molten layer of substantial thickness of solvent metal and active impurity in said cavity and upon said surface, said semiconductor body being at a temperature above the eutectic temperature of said solvent metal and said semiconductor material, said active impurity being of the type which determines the conductivity type of the integral regrown region, said solvent metal and active impurity being deposited in sufficient quantity to substantially fill said pit and form a molten layer upon said surface to a depth of from approximately 0.2 to 10 mils; cooling said semiconductor body to cause the dissolved semiconductor material to precipitate, together with some atoms of said active impurity upon said surface of said semiconductor body and the surfaces of said cavity; and removing the alloy of solvent metal and semiconductor material and the regrown crystal region from said surface of said semiconductor body, whereby a regrown crystal region and P–N junction having a configuration similar to that of said cavity is formed within said body.

9. The method of producing, defining and positioning an integral P-type regrown crystal region in an N-type silicon body, comprising: forming a pit in a surface of said silicon body, said pit having a configuration similar to the configuration of the regrown crystal region to be formed; depositing a molten layer of substantial thickness of aluminum in said cavity and upon said surface, said silicon body being at a temperature above the eutectic temperature of said aluminum and said silicon, said aluminum being deposited in sufficient quantity to substantially fill said cavity and form a molten layer upon said surface to a depth of from 0.2 to 10 mils; cooling said silicon body to cause the dissolved silicon to precipitate, together with some atoms of aluminum, upon said surface of said silicon body and the surfaces of said cavity; and removing the aluminum-silicon alloy and P-type regrown crystal region from said surface of said semiconductor body, whereby a regrown P-type crystal region and P–N junction having a configuration similar to that of said cavity is formed within said silicon body.

10. The method of producing, defining and positioning an integral P-type regrown crystal region in an N-type silicon body, comprising: forming a pit in a surface of said silicon body, said pit being substantially frusto-conical in configuration and having its greatest diameter at said surface of said silicon body, said pit having a substantially planar base lying in a plane substantially parallel to the plane of said surface, said planar base being at a depth of from approximately 1 to 10 mils from said surface; depositing a molten layer of substantial thickness of aluminum in said pit and upon said surface, said aluminum being deposited in sufficient quantity to substantially fill said pit and deposit a molten layer upon upon said surface to a depth of from 0.2 to 10 mils, said silicon body being at a temperature above the eutectic temperature of aluminum and silicon; cooling said silicon body to cause the dissolved silicon to precipitate, together with some atoms of aluminum, upon said surface of said silicon body and the surfaces of said cavity; and removing the aluminum-silicon alloy and P-type regrown crystal region from said surface of said silicon body, whereby a substantially frusto-conical P-type regrown crystal region and substantially frusto-conical P–N junction are formed within said silicon body.

11. The method of producing, defining and positioning an integral P-type regrown crystal region in an N-type silicon body, comprising: forming a cavity in the surface of said silicon body, said pit being substantially frusto-conical in configuration and having its greatest diameter at said surface of said silicon body, said diameter being of the order of from 10 to 100 mils, said frusto-conical cavity having a substantially planar base lying in a plane parallel to the plane of said surface and at a distance of from 1 to 10 mils from said surface; evaporating a molten layer of aluminum onto said surface of said silicon body, said silicon body being at a temperature above the eutectic temperature of aluminum and silicon, said aluminum being deposited by evaporation in sufficient quantity to substantially fill said cavity and form a molten layer upon said surface to a depth of from 0.2 to 10 mils; cooling said silicon body to cause the dissolved silicon to precipitate, together with some atoms of aluminum, upon said surface of said silicon body and the surfaces of said cavity; and removing the aluminum-silicon alloy and P-type regrown crystal region from said surface of said silicon body, whereby a regrown crystal region and P–N junction which are frusto-conical in configuration are formed within said silicon body.

12. The method of producing, defining and positioning an integral regrown crystal region of one conductivity type in a semiconductor crystal body having a predetermined conductivity type comprising: forming a cavity in the surface of said semiconductor body, said cavity having a configuration similar to the configuration of the regrown crystal region to be formed; applying a masking material to cover said surface except for the area defined by said cavity; depositing a molten layer of solvent metal including an active impurity in said cavity sufficient to completely wet the surfaces of said cavity, said semiconductor body being at a temperature above the eutectic temperature of said solvent metal and said semiconductor material; cooling said semiconductor body to cause the dissolved semiconductor material to precipitate, together with some atoms of said active impurity, upon said surfaces of said cavity; and removing said masking material whereby a P–N junction having substantially the configuration of said cavity is formed within said semiconductor body.

13. The method of producing, defining and positioning an integral regrown crystal region of one conductivity type in a semiconductor crystal body having a predetermined conductivity type comprising: forming a cavity in the surface of said semiconductor body, said cavity having a configuration similar to the configuration of the regrown crystal region to be formed; depositing a molten layer of solvent metal including an active impurity in said cavity sufficient to completely wet the surfaces of said cavity, said semiconductor body being at a temperature above the eutectic temperature of said solvent metal and said semiconductor material; cooling said semiconductor body to cause the dissolved semiconductor material to precipitate, together with some atoms of said active impurity, upon said surfaces of said cavity; and removing at least a portion of said surface of said semiconductor body, whereby a P–N junction having substantially the configuration of said cavity is formed within said semiconductor body.

No references cited.